(12) United States Patent
Kato

(10) Patent No.: US 8,454,852 B2
(45) Date of Patent: Jun. 4, 2013

(54) CHAMFERING APPARATUS FOR SILICON WAFER, METHOD FOR PRODUCING SILICON WAFER, AND ETCHED SILICON WAFER

(75) Inventor: Tadahiro Kato, Nishihirakawa (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 958 days.

(21) Appl. No.: 12/448,892

(22) PCT Filed: Jan. 17, 2008

(86) PCT No.: PCT/JP2008/000035
§ 371 (c)(1),
(2), (4) Date: Jul. 14, 2009

(87) PCT Pub. No.: WO2008/093488
PCT Pub. Date: Aug. 7, 2008

(65) Prior Publication Data
US 2009/0324896 A1  Dec. 31, 2009

(30) Foreign Application Priority Data
Jan. 31, 2007  (JP) .................................. 2007-21540

(51) Int. Cl.
*B44C 1/22* (2006.01)
(52) U.S. Cl.
USPC ............... 216/83; 216/88; 438/691; 438/692; 451/41; 451/57
(58) Field of Classification Search
USPC ................. 216/83, 88; 438/691, 692; 451/41, 451/57
See application file for complete search history.

(56) References Cited

U.S. PATENT DOCUMENTS

| 4,864,779 | A | 9/1989 | Ozaki |
| 6,066,031 | A | 5/2000 | Noguchi et al. |
| 6,099,748 | A | 8/2000 | Netsu et al. |
| 6,685,539 | B1* | 2/2004 | Enomoto et al. ................. 451/41 |
| 2005/0142882 | A1* | 6/2005 | Kida et al. ..................... 438/692 |
| 2006/0024915 | A1* | 2/2006 | Kobayashi ..................... 438/455 |
| 2006/0068681 | A1* | 3/2006 | Tsuchiya .......................... 451/5 |

FOREIGN PATENT DOCUMENTS

| JP | A-55-3633 | 1/1980 |
| JP | A-64-51912 | 2/1989 |

(Continued)

OTHER PUBLICATIONS

Supplementary European Search Report dated Oct. 18, 2011 in European Application No. 08 702 776.9.

*Primary Examiner* — Shamim Ahmed
(74) *Attorney, Agent, or Firm* — Oliff & Berridge, PLC

(57) ABSTRACT

The invention is directed to a chamfering apparatus for a silicon wafer to chamfer outer edge of a silicon wafer by using a chamfering grindstone, the chamfering apparatus including at least: a holder holding and rotating a silicon wafer; a chamfering grindstone chamfering the outer edge of the silicon wafer held by the holder; and a control apparatus for controlling a chamfered shape by controlling a relative position of the outer edge of the silicon wafer and the chamfering grindstone by numerical control, wherein the control apparatus controls and changes the relative position of the outer edge of the silicon wafer and the chamfering grindstone at the time of chamfering depending on the circumferential position of the silicon wafer held by the holder, a production method, and an etched silicon wafer. This provides a silicon wafer chamfering apparatus, production method and an etched silicon wafer that can suppress variations in the cross-sectional shape dimensions of a chamfered portion after an etching process.

4 Claims, 18 Drawing Sheets

FOREIGN PATENT DOCUMENTS

| | | |
|---|---|---|
| JP | A-4-330726 | 11/1992 |
| JP | A-10-249689 | 9/1998 |
| JP | A-11-171693 | 6/1999 |
| JP | A-2000-24894 | 1/2000 |
| JP | A-2001-87996 | 4/2001 |

* cited by examiner

CHAMFERING APPARATUS FOR SILICON WAFER, METHOD FOR PRODUCING SILICON WAFER, AND ETCHED SILICON WAFER

TECHNICAL FIELD

The present invention relates to chamfering apparatuses for a silicon wafer which chamfer the outer edge of a silicon wafer, methods for producing a silicon wafer, and etched silicon wafers and, in particular, to a chamfering apparatus, a production method, and an etched silicon wafer relating to the cross-sectional shape of a chamfered portion of a silicon wafer.

BACKGROUND ART

In an advanced device adopting a large diameter silicon wafer typified by a silicon wafer having a diameter of 300 mm, for example, a stepper adopting a technology (immersion exposure technology) for enhancing the resolution by sandwiching liquid (normally, pure water) between an objective lens and a silicon wafer is gradually being adopted. In exposure using this technology, if a wafer chamfered portion varies in shape, the liquid tends to leak from the wafer chamfered portion when the outermost edge of the wafer is scanned. Thus, many device makers are required to conduct a review, such as shortening the dimensions of the wafer chamfered shape, or improve the dimensional precision.

Moreover, in order to improve productivity of a heat treatment process in which diffusion or film formation in a device process is performed, the time the temperature takes to rise and fall during the heat cycle tends to be shortened. In this case, larger thermal shock than in the past acts on the silicon wafer, causing a crack in the wafer. At the same time, as the conveyance-related speed is improved, a wafer crack may occur due to a contact between a wafer chamfered portion and a conveying portion or a wafer carrier. In order to produce resistance to these thermal stress and mechanical stress, there emerges a need to define the cross-sectional shape dimensions of a chamfered portion of a silicon wafer rigorously.

Here, the cross-sectional shape dimensions of a chamfered portion are explained based on an example of the cross-sectional shape of a chamfered portion shown in FIG. 17. As for the standards for the cross-sectional shape of a chamfered portion, the dimensions are defined as follows.

(1) A position of a point P1 at which a reference L2 at a distance of 450 μm away from a chamfered portion farthest end reference L1 toward the center of the wafer intersects with a front surface-side chamfered portion cross-section is set as a front surface reference L3. In the chamfered portion, a straight line connecting a point P2 which is located at a distance of 25 μm parallel to the reference L3 away from the reference L3 and a point P3 located at a distance of 70 μm parallel to the reference L3 away from the reference L3 is defined as L6. And the angle which the reference L3 forms with the straight line L6 is defined as θ1. Likewise, on the back surface side, θ2 is defined. In general, they are referred to as the angle of chamfer.

(2) A point of intersection of the reference L3 with the straight line L6 is defined as a point P4, and a distance between the point P4 and the reference L1 is defined as A1. Likewise, on the back surface side, A2 is defined. They are generally referred to as a surface width.

(3) A distance between a point P5 and a point P6, at which a straight line L7 which is a line moved 50 μm from the chamfered portion end reference L1 parallel to it toward the center of the wafer intersects with a chamfered portion cross-section, is defined as BC. This is also, in general, referred to as a surface width.

The measurement of the above dimensions is carried out by performing binarization image processing on a captured image by a common transmitted light method. It is common to carry out the measurement at four or eight points in the plane of a wafer with reference to a notch position (see FIG. 18 showing an example of the measurement points of the cross-sectional shape dimensions of the chamfered portion). When the measurement is carried out at four points, these points are four points at intervals of 90° including the neighborhood of a notch (for example, a point which is 9° distant from the notch). Also, when the measurement is carried out at eight points, these points are eight points at intervals of 45° including the neighborhood of the notch (for example, a point which is 9° distant from the notch). However, the measurement points are not limited to them. Furthermore, a point, which is 9° distant from the notch is set as a measurement point because no chamfered portion is present in the notch portion, and the angle is not particularly limited to 9°.

Although the target values (the center values of the standards) of the cross-sectional shape parameters A1, A2, BC, θ1, and θ2 of the chamfered portion described above vary among customers who manufacture a device, the desired values and specification values of variations in these parameters are becoming increasingly rigorous with each passing year. Required variations are expected to be ±80 μm or less for the 65 nm node, ±40 μm or less for the 45 nm node, and ±25 μm or less for the 32 nm node.

Amid calls for the equalization of such cross-sectional shape dimensions of a chamfered portion, so far, a silicon wafer has been produced by a production process shown in FIG. 4.

First, as shown in FIG. 4(A), it is common to sequentially perform a slicing process for cutting a thin wafer from a single crystal ingot, a chamfering process for preventing a break of the outer edge of the wafer, a lapping process or a double-side grinding process for eliminating variations in the thickness of the wafer, an etching process for removing mechanical damage or contamination introduced by the chamfering, lapping, or grinding, and a mirror polishing process for polishing the chamfered portion and the principal surface or both surfaces of the wafer to a mirror surface. In particular, in order to achieve a rigorous precision of the chamfered shape, chamfering processing is performed again after lapping or grinding of the front and back surfaces.

Moreover, recently, with the aim of reducing the chamfering process, as shown in FIG. 4(B), a method in which chamfering is performed in only one stage after double-side grinding has been devised.

Incidentally, when the lapping process is performed in the production method of FIG. 4(A), it is necessary to perform rough chamfering before lapping.

In the chamfering process of FIG. 4, in general, chamfering is performed by pressing a chamfering wheel having a formed groove against the outer edge of a wafer and thereby transferring the shape of the groove to the wafer (in FIG. 5, an outline of an example of a form chamfering method is shown). Since the wheel rotates at high speed, and the wafer also rotates, it is possible to transfer the chamfered shape uniformly in a direction of the circumference of the wafer.

Furthermore, in the lapping process, processing is performed on the wafer held by a carrier in the space between rotating cast-iron upper and lower turn tables while supplying slurry containing suspended abrasive grains consisting mainly of alumina. In the double-side grinding process, processing is performed with the wafer held in the space between wheels facing each other and rotating at high speed, the wheels formed with grindstones containing dispersed diamond abrasive grains.

Furthermore, in order to meet a rigorous requirement for flatness, in the etching process, an alkaline solution, such as a sodium hydroxide solution or a potassium hydroxide solution, that is highly capable of maintaining the shape of the front and back surfaces of a lap or a raw material wafer is used. This is because acid etching may reduce the flatness of the principal surface.

As described above, in order to achieve the equalization of the cross-sectional shape dimensions of a chamfered portion, a production method in which it is common practice to chamfer the outer edge of a silicon wafer in circumferential positions into a uniform shape generally in the chamfering process, and then the etching process is performed by alkali etching that is highly capable of maintaining the shape of the front and back surfaces has so far been used.

However, since an alkalie solution has crystal orientation-dependent etching anisotropy, the silicon wafer after the etching process shows different degrees of surface roughness depending on the circumferential position of the chamfered portion corresponding to the crystal orientation (see Japanese Unexamined Patent Publication (Kokai) No. 2001-87996). In addition, the shape of cross section varies.

Therefore, with the above-described conventional production method, it was impossible to meet the recent demands to reduce variations in the cross-sectional shape dimensions of the chamfered portion to extremely small variations, for example, to ±25 mm or less for the 32 nm node.

DISCLOSURE OF INVENTION

The present invention has been made in view of the problem described above, and an object thereof is to provide a chamfering apparatus for a silicon wafer, production method and an etched silicon wafer that can suppress variations in the cross-sectional shape dimensions of a chamfered portion after an etching process, in order to achieve the precision of the cross-sectional shape of a wafer chamfered portion, the precision required by the customer.

In order to solve the above problem, the present invention provides a chamfering apparatus for a silicon wafer to chamfer an outer edge of a silicon wafer by using a chamfering grindstone, the chamfering apparatus comprising at least: a holder holding and rotating a silicon wafer; a chamfering grindstone chamfering an outer edge of the silicon wafer held by the holder; and a control apparatus for controlling a chamfered shape by controlling the relative position of the outer edge of the silicon wafer and the chamfering grindstone by numerical control, wherein the control apparatus controls and changes the relative position of the outer edge of the silicon wafer and the chamfering grindstone at a time of chamfering depending on a circumferential position of the silicon wafer held by the holder.

With the above-described silicon wafer chamfering apparatus, unlike a conventional apparatus which uniformly chamfers a outer edge of a silicon wafer, the relative position of the outer edge of the silicon wafer and the chamfering grindstone at the time of chamfering is controlled and changed depending on the circumferential position of the silicon wafer, making it possible to perform chamfering in such a way as to change the chamfered shape of the outer edge of the silicon wafer depending on the circumferential position of the silicon wafer. Therefore, a silicon wafer whose chamfered shape is intentionally changed depending on the circumferential position can be obtained, and it is possible to obtain, after etching, an etched silicon wafer in which variations in the cross-sectional shape dimensions of the chamfered portion are suppressed to a minimum.

Moreover, the present invention provides a method for producing a silicon wafer, having at least the steps of: chamfering an outer edge of a silicon wafer; and performing etching processing on at least a chamfered portion of the silicon wafer after the chamfering step, wherein a silicon wafer is produced by performing the etching step after performing the chamfering step in such a way as to change the chamfered shape of an outer edge depending on a circumferential position of the silicon wafer such that a cross-sectional shape of the chamfered portion varies depending on the circumferential position of the silicon wafer.

With the above-described silicon wafer production method, since the chamfering step is performed in such a way as to change the chamfered shape of the outer edge depending on the circumferential position of the silicon wafer such that the cross-sectional shape of the chamfered portion varies depending on the circumferential position of the silicon wafer, a silicon wafer having an outer edge whose chamfered shape is changed depending on the circumferential position can be first obtained. After this, the etching step is performed, whereby a silicon wafer is produced. As a result, even when non-uniform etching is performed depending on the circumferential position in the etching step, it is eventually possible to obtain a silicon wafer in which variations in the cross-sectional shape dimensions of the chamfered portion are suppressed extremely.

At this time, it is preferable that changing of the chamfered shape depending on the circumferential position of the silicon wafer is performed based on an amount of change in shape caused by etching depending on the circumferential position of the silicon wafer in the etching step.

As described above, by performing changing of the chamfered shape depending on the circumferential position of the silicon wafer based on the amount of change in shape caused by etching depending on the circumferential position of the silicon wafer in the etching step after the chamfering step, it is possible to obtain a silicon wafer of high quality after etching, the silicon wafer in which variations in the cross-sectional shape dimensions of the chamfered portion are further suppressed.

Moreover, it is preferable that the amount of change in shape caused by etching depending on the circumferential position of the silicon wafer is obtained by conducting a test in advance.

As described above, by obtaining the amount of change in shape caused by etching depending on the circumferential position of the silicon wafer by conducting a test in advance, it is possible to obtain the amount of change in shape caused by etching depending on the circumferential position of the silicon wafer accurately. This makes it possible to obtain a silicon wafer whose chamfered portion has cross-sectional shape dimensions with higher precision.

It is preferable that the etching step is performed by using a sodium hydroxide solution and/or a potassium hydroxide solution.

As described above, by performing the etching step by using a sodium hydroxide solution and/or a potassium hydroxide solution, it is possible to perform etching while relatively suppressing a change in shape of the principal surface of the silicon wafer caused by etching processing, and thereby obtain a wafer with a high degree of flatness.

A silicon wafer produced by the method for producing a silicon wafer of the invention described above is, although previously the cross-sectional shape of the chamfered portion would become non-uniform and exhibit wide variations after the etching step, a silicon wafer whose chamfered portion has cross-sectional shape dimensions with high precision even after the etching step.

Furthermore, the present invention provides an etched silicon wafer, wherein variations in the cross-sectional shape dimensions of a chamfered portion in a circumferential direction of the wafer are ±10 μm or less.

As described above, the etched silicon wafer of the invention, in which variations in the cross-sectional shape dimensions of a chamfered portion in a circumferential direction of the wafer are ±10 μm or less, is an etched silicon wafer of high quality in which variations are suppressed extremely, compared to a conventional etched silicon wafer in which variations are of the order of ±40 μm, for example.

Conventionally, even in a wafer chamfered uniformly by using a form chamfering apparatus, after an alkali etching step, the cross-sectional shape of the uniform chamfered portion varies depending on the crystal orientation due to etching anisotropy, and the cross-sectional shape becomes non-uniform. By contrast, according to the present invention, it is possible to obtain a silicon wafer whose chamfered portion has a uniform cross-sectional shape in a circumferential direction after an etching step.

BEST MODE FOR CARRYING OUT THE INVENTION

Hereinafter, an embodiment of the invention is explained; the invention, however, is not limited thereto.

In a conventional silicon wafer production method, it is common practice to chamfer the outer edge of a silicon wafer in each of circumferential positions into a uniform shape in a chamfering process, and then perform an etching process by alkali etching that is highly capable of maintaining the shape of the principal surface.

However, even when the uniform chamfered shape is obtained by the chamfering process, in the etching process that follows, due to crystal orientation-dependent etching anisotropy of an alkalie solution, the cross-sectional shape dimensions of the chamfered portion vary. As a result, although the conventional method maintains the flatness of the principal surface, it cannot meet the demands for high-precision cross-sectional shape dimensions of the chamfered portion.

Therefore, the inventor conducted a study on the chamfering process and the etching process, and found that, without being bound by the conventional common practice of uniformly chamfering the outer edge in the chamfering process, by performing, on the contrary, chamfering while changing the chamfered shape of the outer edge depending on the circumferential position (that is, depending on the crystal orientation), and thereby obtaining a chamfered portion having a non-uniform cross-sectional shape, contrarily, it is possible to make uniform the cross-sectional shape of a chamfered portion of a silicon wafer after the etching process. In particular, the inventor found that, with consideration given to the amount of change in the shape caused by etching according to the circumferential position in the etching process (that is, a difference in the etching amount arising from the crystal orientation-dependent etching anisotropy, which, as described later, is reflected in a difference in the end R of the chamfered shape after the etching process), by changing the chamfered shape depending on the circumferential position, it is possible to produce a silicon wafer of extremely high quality, the silicon wafer whose chamfered portion after the etching process has a more uniform cross-sectional shape, and completed the invention.

Here, first, the study conducted by the inventor on the chamfering process and the etching process described above is described in detail. By a conventional method, the outer edge of a silicon wafer is chamfered uniformly, and alkali etching is then performed. The following is a study of the cross-sectional shape of a chamfered portion after the chamfering process and the cross-sectional shape of the chamfered portion after the etching process.

(A Chamfering Process in the Conventional Production Method)

Figure 4:
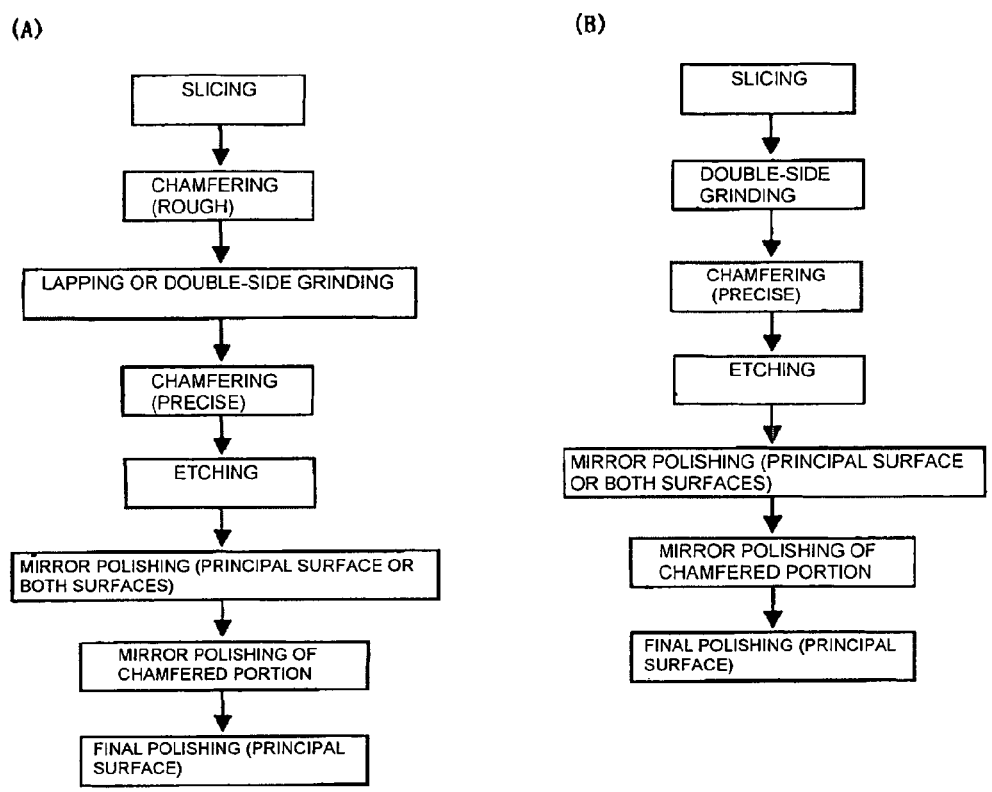
FIG. 4(A) is a flow diagram for explaining an example of a process of a conventional silicon wafer production method. (B) is a flow diagram for explaining another example of a process of a conventional silicon wafer production method.

A silicon wafer was produced in line with a process shown in FIG. 4(A).

Slicing was performed with slurry containing GC#1500 abrasive grains as the main ingredient by using a multi-wire saw apparatus, whereby a silicon wafer with a crystal orientation (100) and having a diameter of 300 mm and a thickness of 910 μm was obtained. Then, after the outer edge of this silicon wafer was roughly chamfered by using a #600 metal bonded wheel, lapping was performed with slurry containing FO#1200 as the main ingredient, whereby a silicon wafer having a thickness of about 815 μm was prepared. Incidentally, although the above-described rough chamfering was performed by using a form chamfering grindstone shown in FIG. 5, it was performed mainly for the purpose of preventing chipping, and no thought was given to the precision of the shape.

Figure 5:
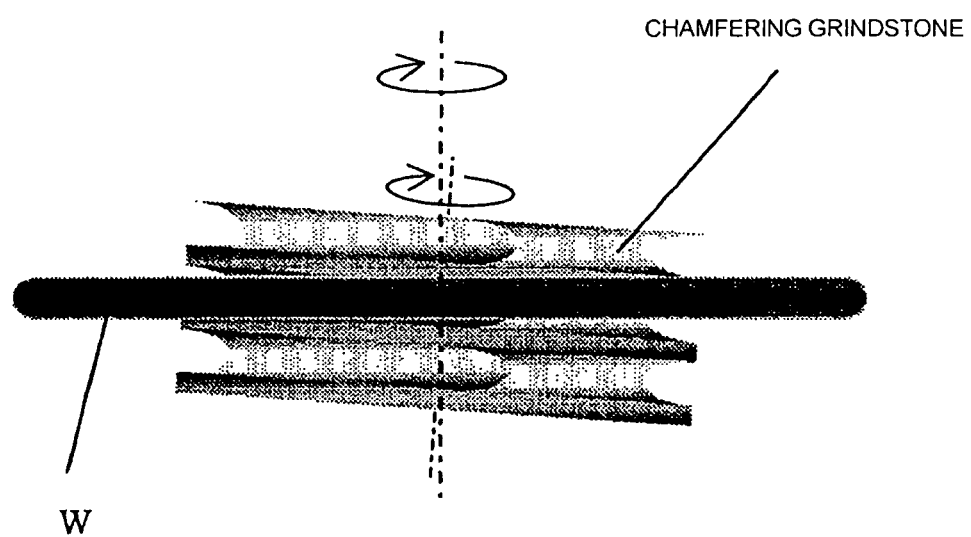
FIG. 5 is a schematic diagram for explaining an example of a form chamfering method.

Then, on the silicon wafer prepared by performing the lapping described above, by additionally using a #3000 resin bonded wheel, as shown in FIG. 5, with a chamfering apparatus adopting a method of transferring the groove shape of the grinding wheel to the wafer edge face, precise chamfering processing was performed in such a way as to make the cross-sectional shape of a chamfered portion uniform.

Figure 9:
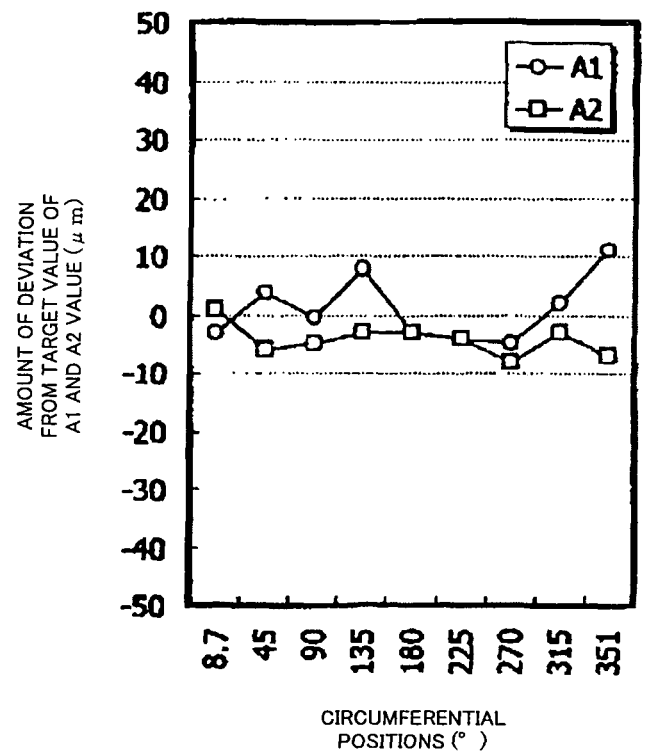
FIG. 9 is a graph for explaining a circumferential change in an A1 value and an A2 value of the cross-sectional shape dimensions of a chamfered portion immediately after chamfering performed by a conventional method.
Figure 10:
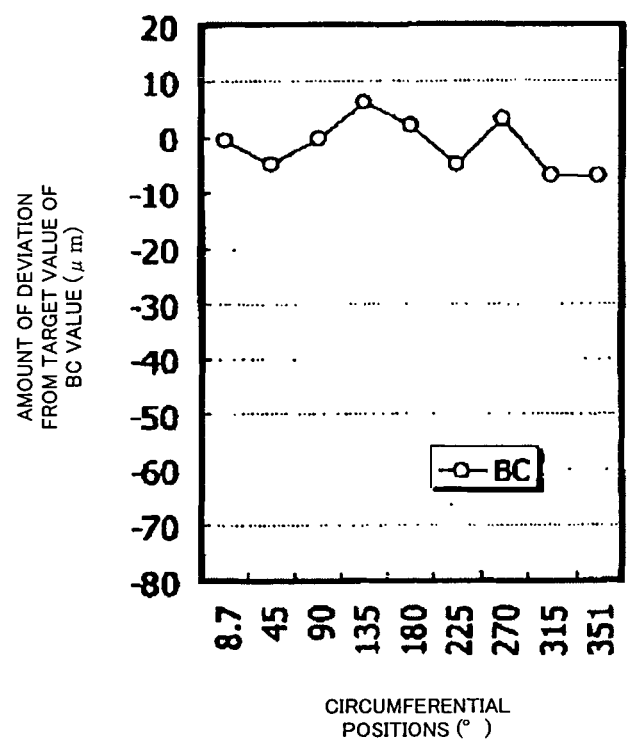
FIG. 10 is a graph for explaining a circumferential change in a BC value of the cross-sectional shape dimensions of a chamfered portion immediately after chamfering performed by the conventional method.
Figure 17:
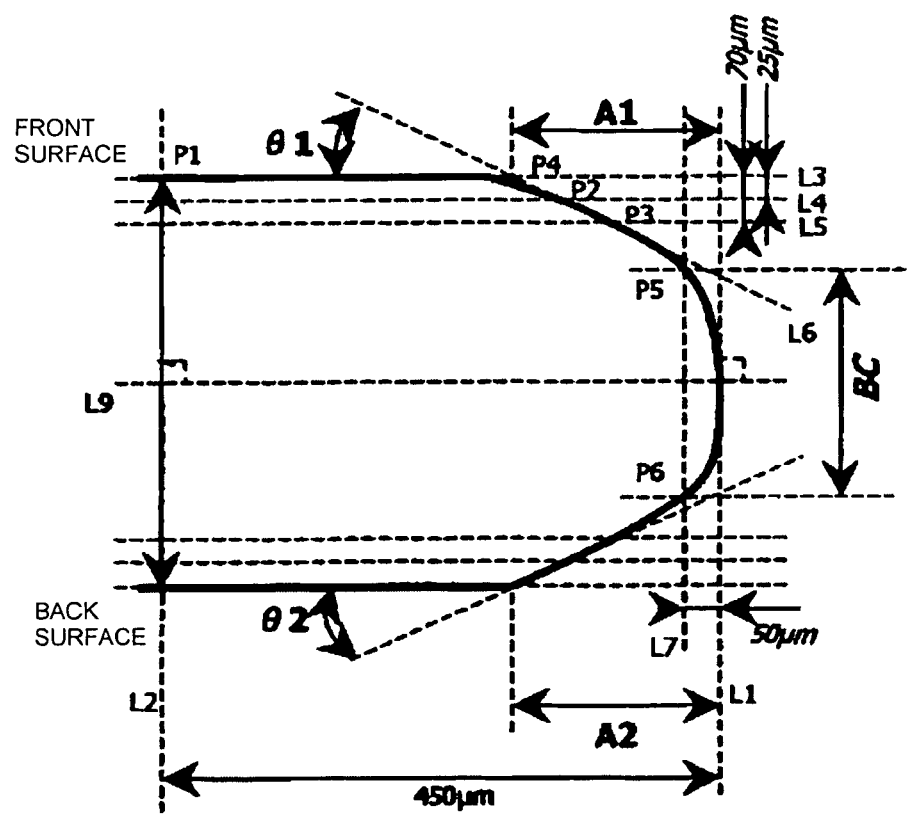
FIG. 17 is an explanatory diagram for explaining the definition of the cross-sectional shape dimensions of a chamfered portion.
Figure 18:
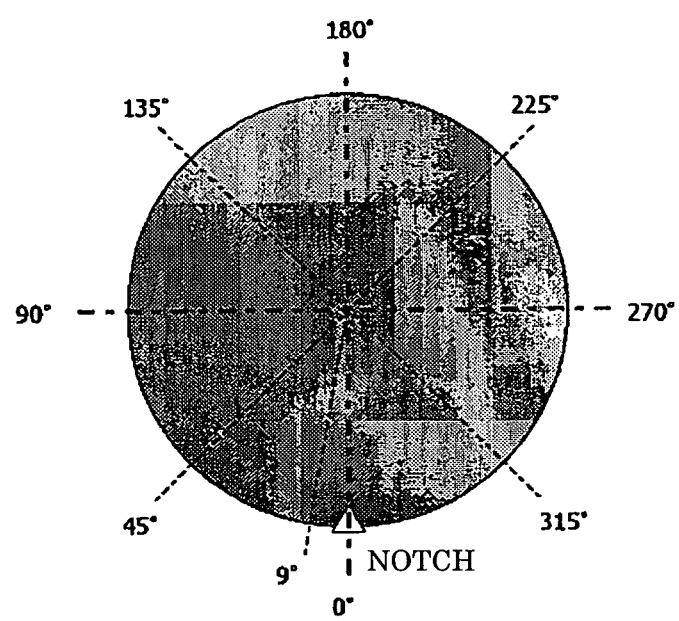
FIG. 18 is an explanatory diagram for explaining an example of the measurement points of a chamfered shape.

At this point, an A1 value, an A2 value, and a BC value (see FIG. 17) of the cross-sectional shape dimensions of the chamfered portion were measured at nine points in the plane of the silicon wafer, to be more precise, nine points at intervals of 45°, including 8.7° and 351°, with reference to a notch. For the A1 value and the A2 value, the measurement results shown in FIG. 9 were obtained; for the BC value, the results shown in FIG. 10 were obtained. In FIGS. 9 and 10, the amounts of deviation from the target values of the A1 value, the A2 value, and the BC value according to the circumferential direction of the silicon wafer are shown.

As is clear from FIGS. 9 and 10, after the chamfering process by the conventional method, over the whole circumference of the silicon wafer, the A1 value, the A2 value, and the BC value vary in a condition that the amounts of deviation from the respective target values fall within about ±10 μm, it was confirmed that the almost uniform chamfered cross-sectional shape was obtained, and no distinctive tendency was observed in the circumferential direction.

(An Etching Process in the Conventional Production Method)

Next, the silicon wafer after the precise chamfering process described above was immersed in a sodium hydroxide solution having a weight concentration of about 52% and being heated to about 75° C. for ten minutes, and was thereby etched to a depth of about 20 μm.

An alkalie solution typified by a sodium hydroxide solution is supposed to be able to etch the whole surface uniformly without impairing the shape of a wafer, in particular, the flatness of the principal surface thereof, and is adopted in etching processing of a silicon wafer nowadays (see, for example, Japanese Unexamined Patent Publication (Kokai) No. 11-171693).

The results of measurement of the cross-sectional shape dimensions of the chamfered portion of the silicon wafer after the alkali etching process described above at the same points as those described above under the same measurement conditions as those described above are shown in FIGS. 11 and 12.

Figure 11:
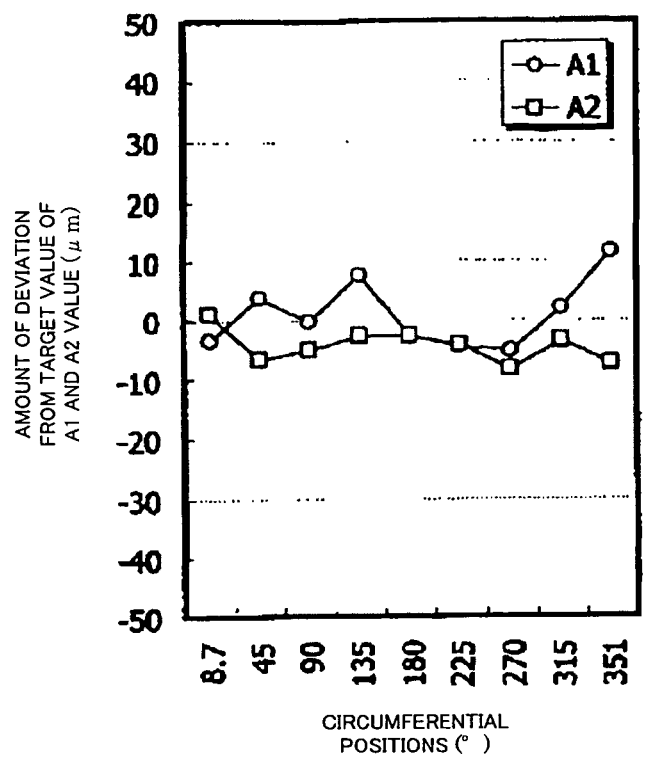
FIG. 11 is a graph for explaining a circumferential change in an A1 value and an A2 value of the cross-sectional shape dimensions of a chamfered portion immediately after etching performed by the conventional method.

Although there is no great change in the A1 value and the A2 value, a significant change is observed in the BC value. That is, the amounts of deviation from the target values of A1 and A2 shown in FIG. 11 are not greatly changed regarding a relative shape before etching (that is, after the precise chamfering process) in the circumferential positions (It is to be noted that there is a change of about −30 μm in absolute value).

Figure 12:
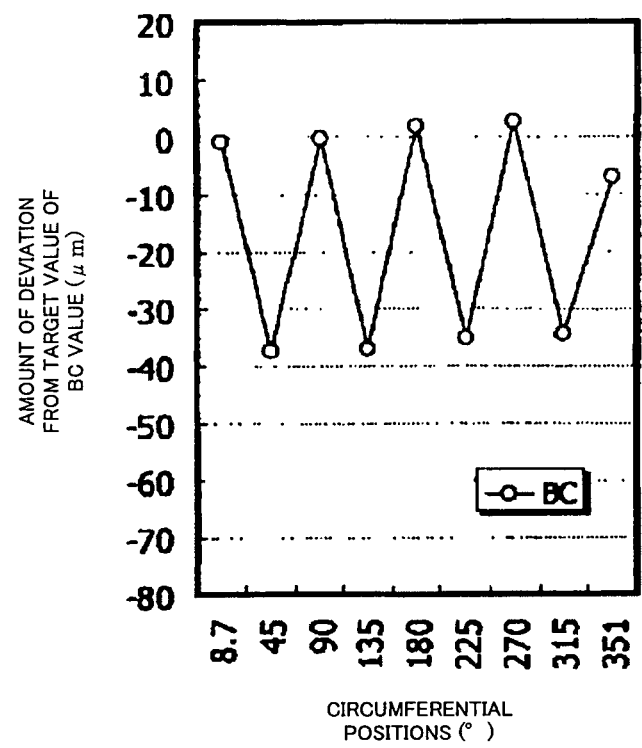
FIG. 12 is a graph for explaining a circumferential change in a BC value of the cross-sectional shape dimensions of a chamfered portion immediately after etching performed by the conventional method.

However, the amount of deviation from the target value of BC shown in FIG. 12 is changed significantly depending on the circumferential position. In particular, with reference to a notch, compared to points at 8.7°, 90°, 180°, 270°, and 351° (referred to as 90°-interval points), at points at 45°, 135°, 225°, and 315° (referred to as 45°-interval points), the BC values are shortened by about 40 μm. Furthermore, they are up to −40 μm away from the target value at the maximum. In other words, there are ±40 μm variations with reference to the target value. Since such a difference in the cross-sectional shape dimensions of the chamfered portion remains unchanged in a process that follows etching, there are at least ±40 μm variations at the final product stage. This makes it difficult to meet even the demands from a customer who supports the 45 nm node for which variations are set to ±40 μm or less, not to mention the 32 nm node for which variations are set to ±25 μm or less.

(Regarding the Cross-Sectional Shape of the Chamfered Portion after the Etching Process)

The above-described change in the BC value of the cross-sectional shape dimensions of the chamfered portion depending on the circumferential position, the change which becomes obvious by alkali etching, is believed to be due to the crystal orientation of the silicon wafer acting as anisotropy at the time of etching.

Figure 7:
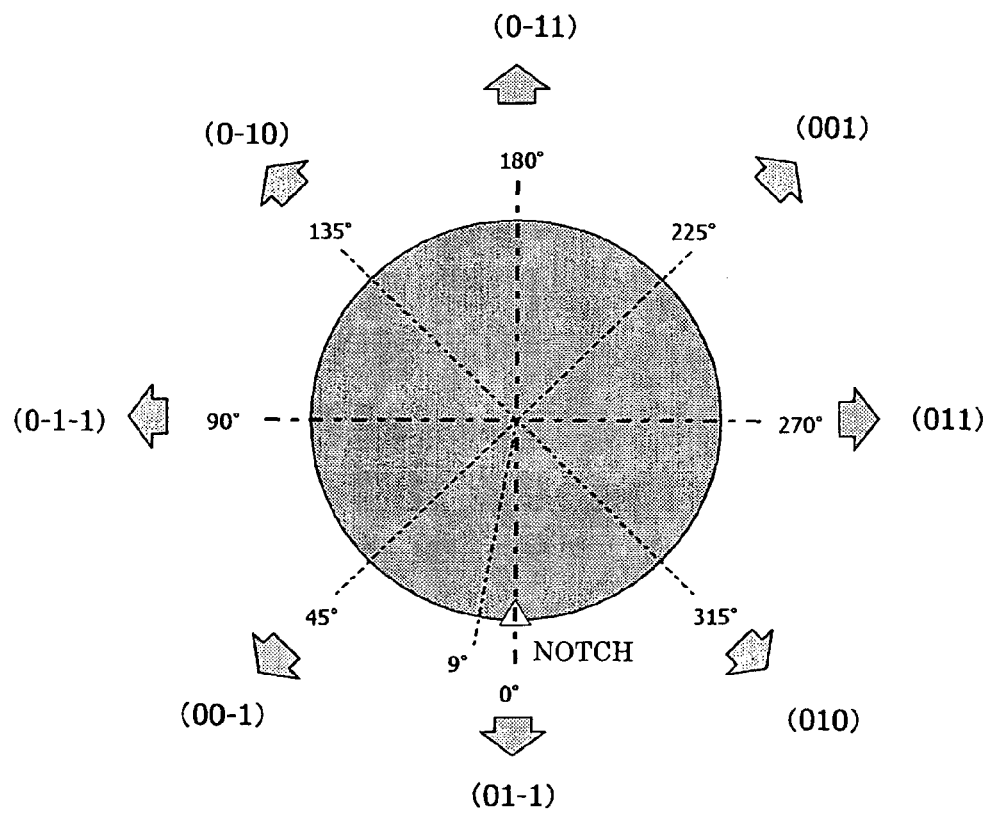
FIG. 7 is an explanatory diagram for explaining common positions to measure chamfered shapes and crystal orientations.

In the example described above, a silicon wafer having a (100) crystal axis on the principal surface is used. In FIG. 7, the crystal orientation corresponding to the circumferential direction of each measurement point when a common (01-1) orientation is set as a notch orientation is shown. With reference to the notch (01-1), 90°: (0-1-1), 180°: (0-11), and 270°: (011) can be considered to be equivalent, and 45°: (00-1), 135°: (0-10), 225°: (001), and 315°: (010) can be considered to be equivalent.

Therefore, it is believed that etching becomes different between an orientation equivalent to (001) and an orientation equivalent to (011), and the anisotropy of the cross-sectional shape of the chamfered portion is observed as in FIG. 12 which shows the measurement results of the BC value.

Figure 8:
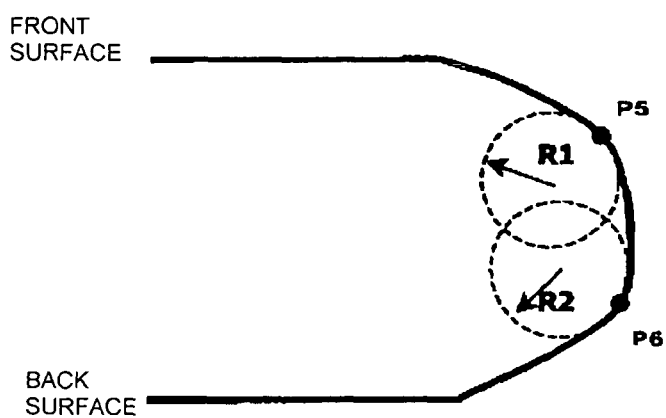
FIG. 8 is an explanatory diagram for explaining an end R of cross-sectional shape dimensions of a chamfered portion.
Figure 13:
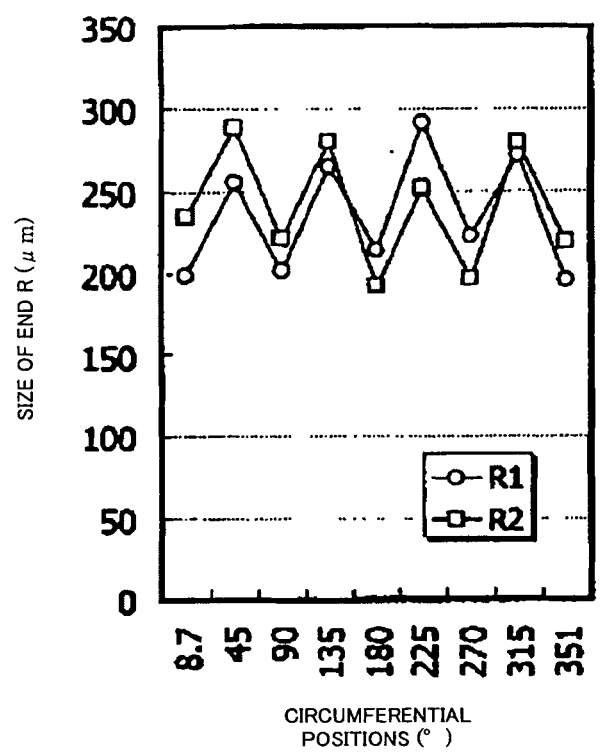
FIG. 13 is a graph for explaining a circumferential change in an end R value of the cross-sectional shape dimensions of a chamfered portion immediately after etching performed by the conventional method.

Furthermore, the inventor conducted the study, and, as a result of analyzing, at each measurement point, the sizes of ends R1 and R2 defined as circles inscribed in the cross-sectional shape of the chamfered portion at points P5 and P6 (see FIG. 17), respectively, as shown in FIG. 8, found that, as in the case of the BC value, they differ depending on the circumferential position. The results thus obtained are shown in FIG. 13. As is clear from FIG. 13, the sizes (radii) of the ends R1 and R2 differ by about 40 μm to 50 μm between the orientation equivalent to (001) and the orientation equivalent to (011).

Here, the relationship between the end R and the BC value is described.

Figure 16:
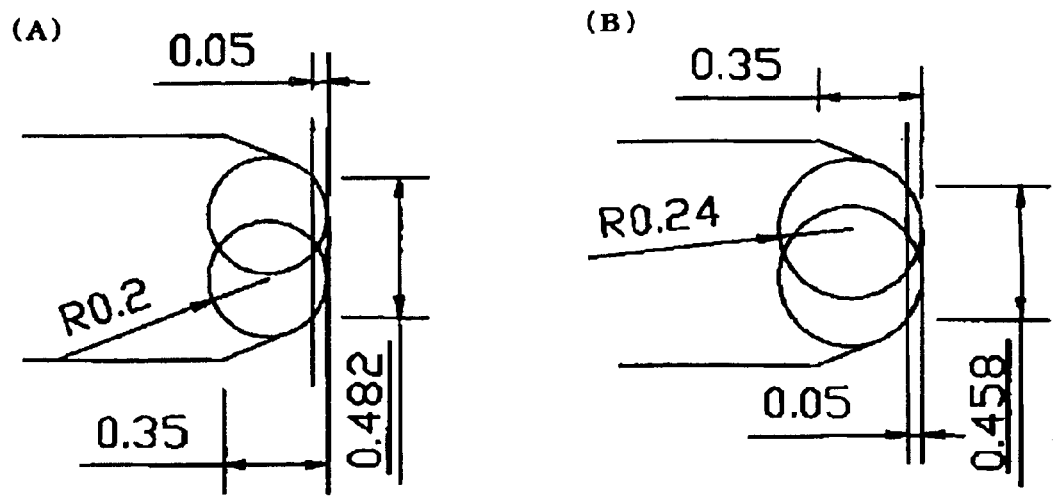
FIG. 16 is an explanatory diagram for explaining the relationship between an end R value and a BC value of the cross-sectional shape dimensions of a chamfered portion. (A) A case where an end R=0.2 mm. (B) A case where an end R=0.24 mm.

As an example shown in FIG. 16, the BC value varies geometrically depending on the size of the end R. That is, for example, when the radius of the end R is increased by 40 μm from 0.2 mm (FIG. 16(A)) to 0.24 mm (FIG. 16(B)), the BC value is shortened by about 30 μm from 482 μm (FIG. 16(A)) to 458 μm (FIG. 16(B)).

This agrees with the phenomena in FIG. 12 showing the measurement results of the BC value in the circumferential positions after etching and FIG. 13 showing the measurement results of the sizes of the ends R1 and R2 in the circumferential positions after etching. That is, the BC value and the R value are linked to each other, and, for example, the BC value can be made smaller by making the R value larger.

By conducting the above-described study, the inventor found out that the anisotropy of alkali etching to the crystal orientation contributed to the end R of the cross-sectional shape of the chamfered portion, resulting in a change in the BC value.

Then, by using this, in particular, first, the anisotropy (which is reflected in a difference in the etching amount according to the circumferential position of the silicon wafer, that is, a difference in the size of the end R according to the circumferential position after the etching process) of etching to the crystal orientation is obtained by a preliminary test or based on past data or the like. Then, in the chamfering process in a main test, by appropriately setting the size of the end R depending on each circumferential position in such a way as to eliminate the difference in the end R according to the circumferential position of the silicon wafer, chamfering is performed while changing the chamfered shape of the outer edge. As a result, after the chamfering process, the chamfered portion has a non-uniform cross-sectional shape because the shape varies depending on the circumferential position; however, etching is then performed on the chamfered portion in such a way that the above-described non-uniform shape is canceled after the subsequent etching process. That is, it is eventually possible to obtain a high-quality etched silicon wafer in which variations in the cross-sectional shape dimensions of a chamfered portion are suppressed extremely. These are the findings of the inventor.

Incidentally, although the explanation was based on a flow in FIG. 4(A), the same results can be obtained by using a method shown in FIG. 4(B), the method in which chamfering is performed after double-disc grinding, because the chamfered portion shows the same change in the shape by etching.

Moreover, in the above-described example, a silicon wafer having a (100) orientation on the principal surface is used. However, the same phenomenon occurs with other orientation axes.

Hereinafter, an embodiment of the invention is explained with reference to the drawings; the invention, however, is not limited thereto.

Figure 1:
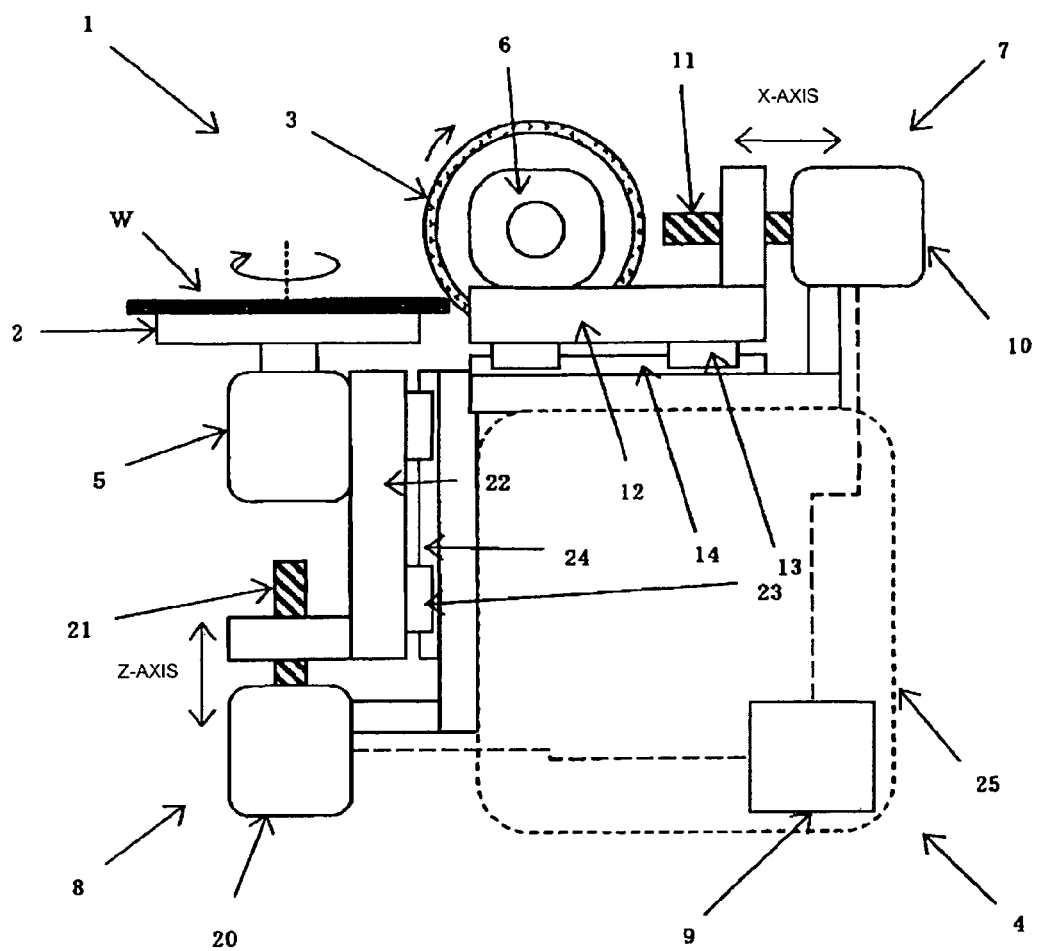
FIG. 1 is a schematic diagram for explaining an example of a silicon wafer chamfering apparatus of the invention.

In FIG. 1, an outline of a silicon wafer chamfering apparatus of the invention is shown. As shown in FIG. 1, a chamfering apparatus 1 of the invention has a holder 2 which holds a silicon wafer W and rotates it, a chamfering grindstone 3 which chamfers the outer edge of the silicon wafer-W held by the holder 2, and a control apparatus 4 which controls the relative position of the outer edge of the silicon wafer W and the chamfering grindstone 3 by numerical control.

Hereinafter, the components described above are described in detail.

First, the holder 2 may be of any type as long as it can hold and fix the silicon wafer W during chamfering, and, for example, a holder of the vacuum sucking type can be used. Moreover, it is provided with a mechanism for rotating it, such that the whole outer edge of the silicon wafer W that it holds can be chamfered. For example, as shown in FIG. 1, the holder 2 has a holder-rotary drive motor 5 located under it such that the holder 2 itself is rotated, whereby it is possible to achieve a mechanism for rotating the held silicon wafer W.

The holding mechanism and the rotary mechanism of the holder 2 are not particularly limited, and may be configured in the same manner as the conventional holding mechanism and rotary mechanism.

Next, the chamfering grindstone 3 is described. The chamfering grindstone 3 is not particularly limited as long as it can chamfer the outer edge of the silicon wafer W. According to the nature of the invention, in order to make it easy to perform chamfering while changing the chamfered shape depending on the circumferential direction of the silicon wafer W, as shown in FIG. 1, it is possible to use a chamfering grindstone of the external cylinder type, for example. Furthermore, the chamfering grindstone 3 can rotate by means of a chamfering-grindstone-rotary drive motor 6.

Moreover, the control apparatus 4 has a mechanism 7 for moving the position of the chamfering grindstone 3 along an X-axis direction shown in FIG. 1, a mechanism 8 for moving the positions of the holder 2 and the silicon wafer W held by it along a Z-axis direction, and an NC controller 9 which numerically controls the movement mechanisms 7 and 8.

In the movement mechanism 7 for the chamfering grindstone 3, a slide table 12 is coupled to an X-axis drive motor 10 via an X-axis feed screw 11, and the slide table 12 can slide on a slide rail 14 by a guide 13. Moreover, on the slide table 12, the above-described chamfering grindstone-rotary-drive motor 6 is fixed. That is, the chamfering grindstone 3 can move (move forward/backward) in the X-axis direction by the X-axis drive motor 10 through the slide table 12.

In addition, the movement mechanism 8 for the holder 2 also has a Z-axis drive motor 20, a Z-axis feed screw 21, a slide table 22, a guide 23, and a slide rail 24. By the workings similar to those described above, the holder 2 and the silicon wafer W held by it can move (move up and down) in the Z-axis direction by the Z-axis drive motor 20 through the slide table 22.

The X-axis drive motor 10 and the Z-axis drive motor 20 are connected to the NC controller 9 placed in a chamfering apparatus frame 25, and therefore it is possible to numerically control these drive motors by a program. That is, it is possible to numerically control the movement of the silicon wafer W (the holder 2) in the Z-axis direction and the movement of the chamfering grindstone 3 in the X-axis direction.

Figure 2:
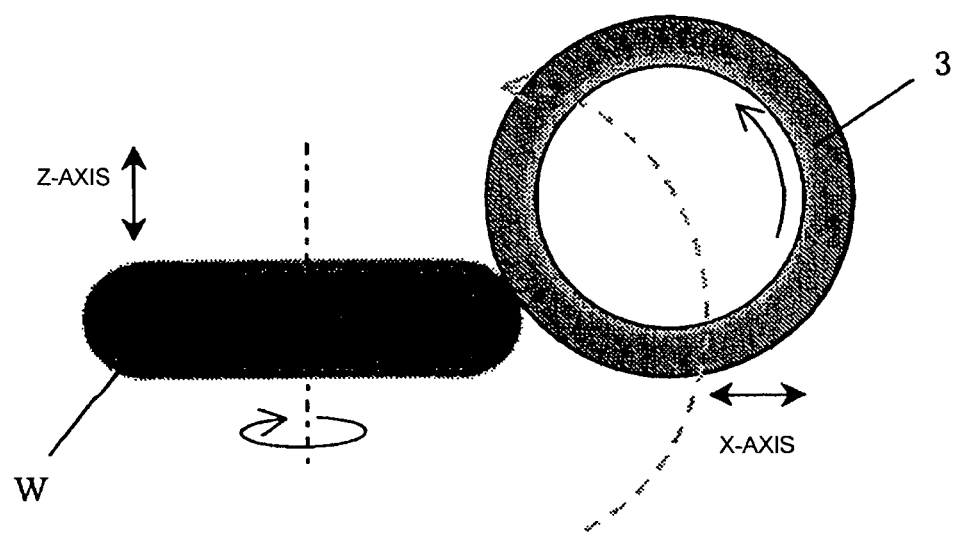
FIG. 2 is an explanatory diagram for explaining a chamfering method in the invention.

FIG. 2 is an explanatory diagram for explaining a chamfering method in the invention, that is, how to control the relative position of the outer edge of the silicon wafer W and the chamfering grindstone 3. By making the control apparatus 4 move the silicon wafer W in the Z-axis direction and move the chamfering grindstone 3 in the X-axis direction, it is possible to change their relative position. Moreover, it is possible to rotate the holder 2 by the holder-rotary drive motor 5 and, concurrently, rotate the silicon wafer W, control the angle of rotation with reference to a notch in the silicon wafer W (not shown in the figure), and chamfer the outer edge in an intended circumferential position. Therefore, it is possible to chamfer the outer edge face of the silicon wafer W according to the circumferential direction while changing it to an intended chamfered shape by using the chamfering grindstone 3.

Incidentally, in the structure shown in FIG. 1, the X-axis direction movement mechanism and the Z-axis direction movement mechanism are allocated to the chamfering grindstone 3 and the silicon wafer W (the holder 2), respectively; the structure, however, is not limited thereto, and, naturally, it is also possible to bring together both of the X-axis direction movement mechanism and the Z-axis direction movement mechanism in the side of the silicon wafer W or the chamfering grindstone 3. Moreover, the direction of rotation of the silicon wafer W and the direction of rotation of the chamfering grindstone 3, which are shown in FIG. 1, are just an example, and are not limited thereto.

With the structure described above, the silicon wafer chamfering apparatus 1 of the invention controls and changes, when it actually chamfers the outer edge of the silicon wafer W, the relative position of the outer edge of the silicon wafer W and the chamfering grindstone 3 freely in the circumferential direction.

Next, a silicon wafer production method of the invention using the above-described chamfering apparatus 1 is described.

Figure 3:
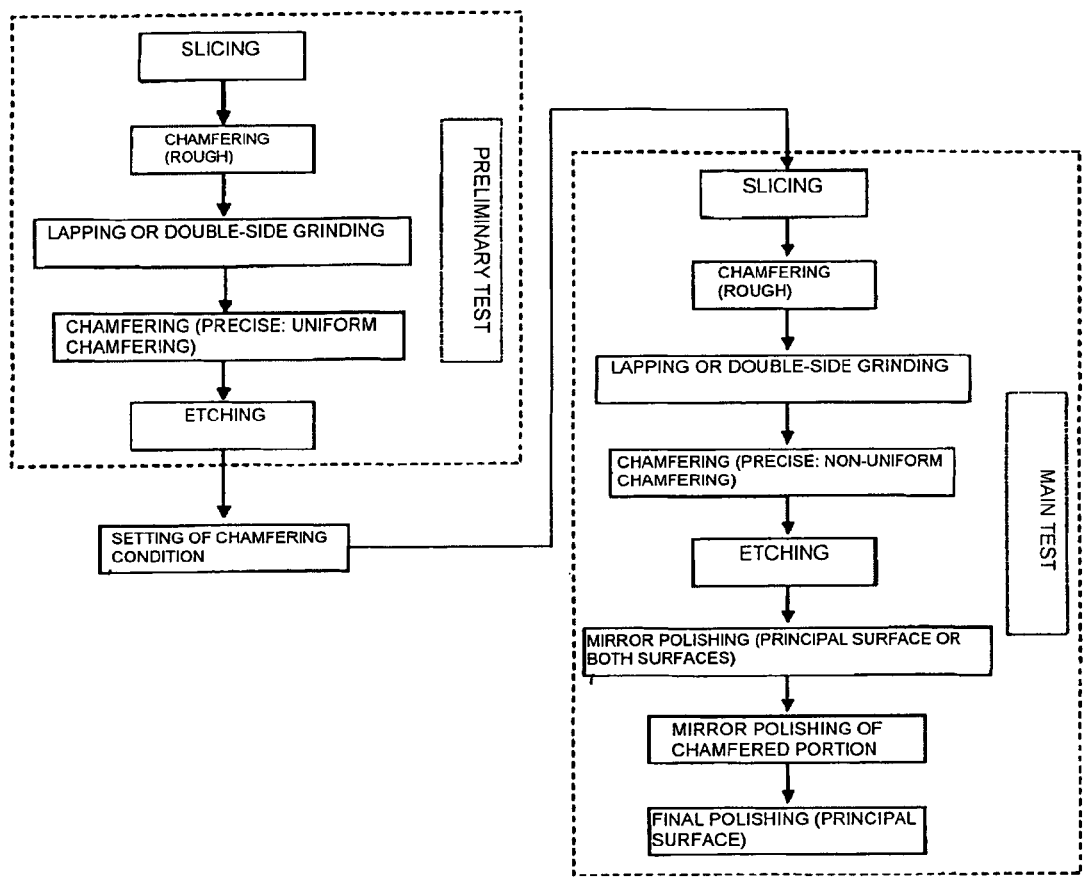
FIG. 3 is a flow diagram for explaining an example of a process of a silicon wafer production method of the invention.

For example, a silicon wafer is produced in line with a process shown in FIG. 3 including a preliminary test. Incidentally, the production method of the invention is not limited thereto; a preliminary test is not necessarily required, and it is also possible to produce a silicon wafer by using, for example, past accumulated data or the like.

First, a sample wafer is prepared for a preliminary test. A silicon single crystal ingot grown by a CZ method, for example, is sliced, whereby a silicon wafer is obtained. Then, the outer edge of this silicon wafer is roughly chamfered, and is then subjected to a lapping process or a double-side grinding process.

Thereafter, the outer edge (on which rough chamfering has been performed) of the silicon wafer is precisely chamfered. A chamfering apparatus used in this process is not particularly limited, and it is simple and easy to use an apparatus similar to the conventional apparatus, that is, the apparatus using a form chamfering method shown in FIG. 5, for example. By using it, precise chamfering is performed in such a way as to make the chamfered shape uniform in each circumferential position of the silicon wafer.

Next, the silicon wafer after the precise chamfering described above is subjected to an etching process. At this time, as alkali etching, for example, a sodium hydroxide solution and/or a potassium hydroxide solution may be used. However, it is not limited thereto, and it is possible to select an appropriate solution on a case-by-case basis.

At this time, as described above, due to the crystal orientation anisotropy of alkali etching, the etching amount differs depending on the circumferential position of the silicon wafer, making the shape of the chamfered portion non-uniform.

After etching is performed, the cross-sectional shape of the chamfered portion in each circumferential position of the etched silicon wafer is measured, and the dimensions such as the BC value and the R value are obtained.

Based on each of the obtained values of the cross-sectional shape dimensions of the chamfered portion after the etching process, in particular, the R value, a chamfering condition in a chamfering process in a main test is set.

That is, based on the above-described values of the cross-sectional shape dimensions, a chamfering condition in a chamfering process is intentionally set so as to form a non-uniform chamfered shape depending on the circumferential position, in order that the non-uniform amount of change in shape in each circumferential position is cancelled based on the amount of change in shape caused by etching depending on the circumferential position of the silicon wafer in an etching process at the time of a main test, to make the cross-sectional shape of the chamfered portion uniform after etching.

For example, in an example shown in FIGS. 12 and 13, in order to reduce variations (FIG. 12) in the BC value depending on the circumferential position after the etching process, based on data (FIG. 13) of the R value linked to the BC value, an R value according to the circumferential position in the chamfering process is set such that variations in the R value depending on the circumferential position after the etching process are reduced. More specifically, it is set so as to eliminate, for example, a difference (250−200=50 μm) between the R value (for R1 in FIG. 13, about 250 μm) of the points at 45°, 135°, 225°, and 315° (45°-interval points) and the R value (for R1 in FIG. 13, about 200 μm) of the points at 8.7°, 90°, 180°, 270°, and 351° (90°-interval points). That is, in the chamfering condition, when the R value is set to $R_{90°}$ for the 90°-interval points, the R value for the 45°-interval points is set to $(R_{90°}-50)$ μm. By doing so, since it is linked to the BC value, variations in the BC value are also expected to be reduced after the etching process.

After the chamfering condition is set as described above, the main test is conducted. First, in a manner similar to the preliminary test, a silicon wafer proceeded to the lapping process or grinding process is prepared. Then, based on the chamfering condition obtained as described above, instead of uniform chamfering, chamfering is performed by controlling and changing the relative position of the outer edge of the silicon wafer W held by the holder 2 and the chamfering grindstone 3 with the control apparatus 4 of the chamfering apparatus 1, thereby forming a chamfered portion whose cross-sectional shape varies depending on the circumferential position.

On such a silicon wafer having a chamfered portion whose cross-sectional shape is non-uniform in the circumferential direction, etching processing is performed under the same condition as in the preliminary test. At this time, as in the case of the preliminary test, the amount of change in shape differs depending on the circumferential position (crystal orientation) due to etching anisotropy.

However, in the production method of the invention, with consideration given to the crystal orientation-dependent etching anisotropy in the etching process, chamfering is intentionally performed in the chamfering process, which is the previous process, so as to make the cross-sectional shape of the chamfered portion non-uniform such that the non-uniform etching (the non-uniform R value) caused by the etching anisotropy, the non-uniform etching depending on the circumferential position, is cancelled. As a result, it is possible to make the cross-sectional shape of the chamfered portion of the silicon wafer after the etching process extremely uniform.

In the conventional method, as described above, even when variations in the cross-sectional shape dimensions (for example, the BC value) of the chamfered portion after the chamfering process are ±10 μm, they become ±40 μm after the etching process.

On the other hand, an etched silicon wafer produced by the above-described production method of the invention can bring the cross-sectional shape dimensions of the chamfered portion close to the target values and reduce variations extremely, to ±10 μm or less. With such a high-quality etched silicon wafer exhibiting small variations, it is possible to meet potential demands from the customer for a high degree of precision (for example, variations set to ±25 μm or less for the 32 nm node) satisfactorily.

Incidentally, a subsequent process such as a mirror polishing process shown in FIG. 3 may be performed as is conventionally done.

Hereinafter, the invention is explained in detail by way of an example of the invention; the invention, however, is not limited thereto.

A silicon wafer is produced in line with a process shown in FIG. 3 including a preliminary test.

(Preliminary Test)

First, as a preliminary test, the following experiment was conducted. This preliminary test was conducted by the production method similar to the above-described conventional method.

Slicing was performed with slurry containing GC#1500 abrasive grains as the main ingredient by using a multi-wire saw apparatus, whereby a silicon wafer with a crystal orientation (100) and having a diameter of 300 mm and a thickness of 910 μm was obtained. Then, after the outer edge of this silicon-wafer was roughly chamfered by using a #600 metal bonded wheel, lapping was performed with slurry containing FO#1200 as the main ingredient, whereby a silicon wafer having a thickness of about 815 μm was prepared. Incidentally, although the above-described rough chamfering was performed by using a form chamfering grindstone shown in FIG. 5, it was performed mainly for the purpose of preventing chipping, and no thought was given to the precision of the shape.

Then, on the silicon wafer prepared by performing the lapping described above, by additionally using a #3000 resin bonded wheel, as shown in FIG. 5, with a chamfering apparatus adopting a method of transferring the groove shape of the grinding wheel to the wafer edge face, precise chamfering processing was performed in such a way as to make the cross-sectional shape of a chamfered portion uniform.

For reference purposes, at this point, an A1 value, an A2 value, and a BC value (see FIG. 17) of the cross-sectional shape dimensions of the chamfered portion were measured at nine points in the plane of the silicon wafer, to be more precise, nine points at intervals of 45°, including 8.7° and 351°, with reference to a notch. Then, for the amount of deviation from the target values of the A1 value and the A2 value, almost the same measurement results as those of FIG. 9 were obtained; for the amount of deviation from the target value of the BC value, almost the same results as those of FIG. 10 were obtained.

As is clear from FIGS. 9 and 10, after the chamfering process by the conventional method, over the whole circumference of the silicon wafer, variations in the A1 value, the A2 value, and the BC value fall within about ±10 μm from the respective target values, it was confirmed that the almost uniform chamfered cross-sectional shape was obtained, and no distinctive tendency was observed in the circumferential direction.

Next, the silicon wafer after the precise chamfering process described above was immersed in a sodium hydroxide solution having a weight concentration of about 52% and being heated to about 75° C. for ten minutes, and was thereby etched to a depth of about 20 μm.

The results of measurement of the cross-sectional shape dimensions of the chamfered portion of the silicon wafer after the alkali etching process described above at the same points as those described above under the same measurement conditions as those described above were similar to those of FIGS. 11 and 12.

Although there is no great change in the A1 value and the A2 value, a significant change is observed in the BC value. That is, the amounts of deviation from the target values of A1 and A2 shown in FIG. 11 are not greatly changed from a relative shape before etching (that is, after the precise chamfering process) in the circumferential positions (It is to be noted that there is a change of about −30 μm in absolute value). In other words, even after the etching process, variations in the values of A1 and A2 are ±10 μm or less, and good results are obtained.

However, the amount of deviation from the target value of BC shown in FIG. 12 is changed significantly depending on the circumferential position. In particular, with reference to a notch, compared to points at 8.7°, 90°, 180°, 270°, and 351° (90°-interval points), at points at 45°, 135°, 225°, and 315° (45°-interval points), the BC values are shortened by about 40 μm. Furthermore, they are up to −40 μm away from the target value, and there are ±40 μm variations with reference to the target value.

Moreover, as a result of measurement of the end R value linked to the BC value, the results similar to those of FIG. 13 were obtained. As is clear from FIG. 13, the values of the ends R1 and R2 in the orientation equivalent to (001) (the points at 45°, 135°, 225°, and 315° (45°-interval points)) are larger than those in the orientation equivalent to (011) (the points at 8.7°, 90°, 180°, 270°, and 351° (90°-interval points)), and they differ by about 40 μm to 50 μm.

(Setting of a Chamfering Condition)

In a main test, by forming a chamfered shape by predicting a change in shape caused by etching according to each circumferential position at the time of a chamfering process before an etching process, the chamfered cross-sectional shape after the etching process is made uniform.

Therefore, based on the results of the preliminary test described above, a chamfering condition in a chamfering process was first set. In this example, focusing attention on the fact that the wafer has a (100) crystal axis on the principal surface, the cross-sectional shape, in particular, the size of the end R, of the chamfered portion of the wafer varies at intervals of 45°, and the BC value are linked to vary, in the chamfering process immediately before the etching process, the size of the end portion R is made to vary in the orientation equivalent to (011) and the orientation equivalent to (001).

Figure 6:
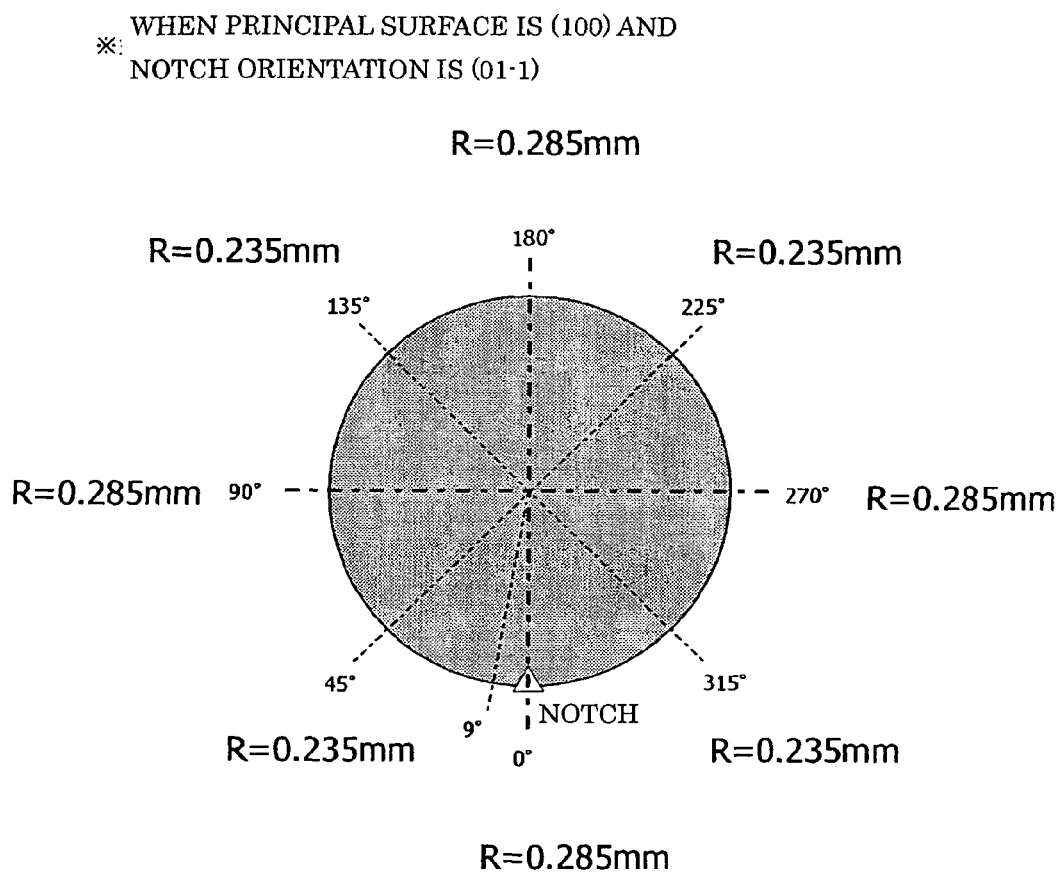
FIG. 6 is an explanatory diagram for explaining an example of a chamfering condition in a main test in the invention.

That is, although, in the chamfering process performed in the preliminary test, form chamfering shown in FIG. 5 by which the groove shape is transferred to the wafer outer edge was performed so as to form R having a constant R value (here, 285 μm) in each circumferential position of the wafer, as the setting for R in the main test, a point equivalent to the (011) orientation was set to 285 μm which is the same value as the normal condition (that is, the condition in the preliminary test described above), and a point equivalent to (001) was set to a value, 235 μm, which is smaller than the above value by 50 m (see FIG. 6). This is based on the measurement results shown in FIG. 13. This is to correct, in the chamfering process in advance, a difference in the R value according to the circumferential position after the etching process. This makes the BC value linked to the R value also vary, resulting in a uniform cross-sectional shape of the chamfered portion after the etching process in the circumferential direction.

Incidentally, although this time the spacing between (011) and (001), that is, the inside of 45°-interval space, is set as linear interpolation, it may be interpolated by mathematical smoothing or a trigonometric function based on a sine function. Although the results immediately after the chamfering are not clearly shown in the figure, the chamfered shape according to the setting is obtained.

(Main Test)

Based on the condition set as described above, a main test was conducted. As is the case with the preliminary test described above, a silicon wafer proceeded to the lapping process was prepared. Next, instead of uniform chamfering, a chamfering process was performed by using the chamfering apparatus 1 of the invention by changing the chamfered shape of the outer edge of the silicon wafer depending on the circumferential position under the above-described chamfering condition (R=285 μm at a point equivalent to the (011) orientation, and R=235 µm at a point equivalent to (001)). As a result, a silicon wafer having a chamfered portion whose cross-sectional shape was non-uniform in the circumferential direction was obtained.

Then, as a result of the silicon wafer thus obtained being subjected to etching processing under the same etching condition as that of the preliminary test, the desired results could be obtained. The amount of deviation from the target value of the BC value in each circumferential position is shown in FIG. 14, and the R value in each circumferential position is shown in FIG. 15.

Figure 14:
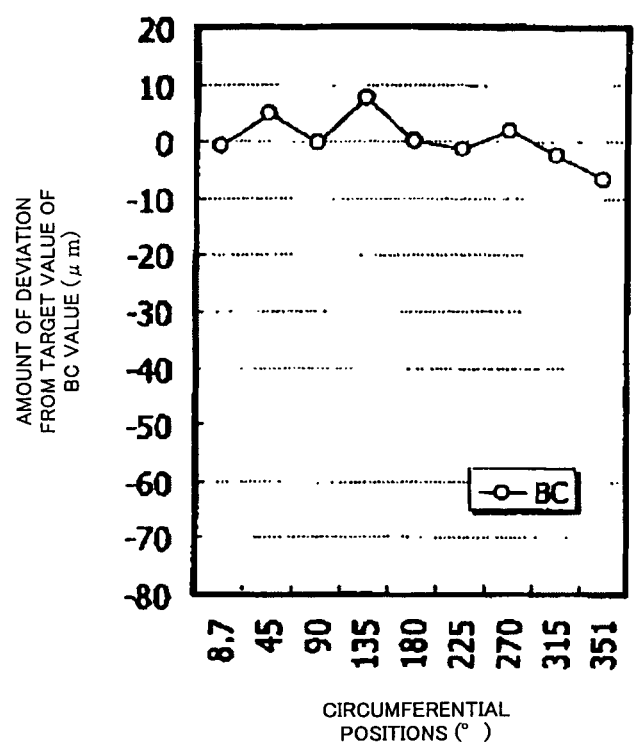
FIG. 14 is a graph for explaining a circumferential change in a BC value of the cross-sectional shape dimensions of a chamfered portion immediately after etching performed according to the invention.

As described above, unlike FIG. 12 showing a case of the preliminary test (the conventional method) exhibiting wide variations (±40 µm from the target value) depending on the circumferential position, as shown in FIG. 14, it was possible to obtain the BC value whose variations from the target value were suppressed to ±10 µm or less over the whole circumference of the silicon wafer.

Figure 15:
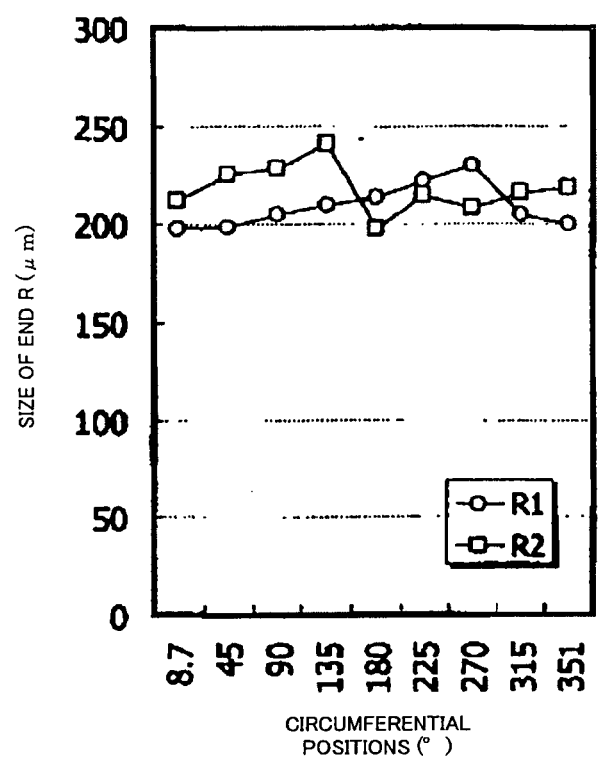
FIG. 15 is a graph for explaining a circumferential change in an R value of the cross-sectional shape dimensions of a chamfered portion immediately after etching performed according to the invention.

Moreover, for the size of the end R of the chamfered shape, unlike FIG. 13 showing a case of the preliminary test (the conventional method) exhibiting periodicity, as shown in FIG. 15, no periodicity was exhibited depending on the circumferential position, and the desired results were obtained.

As described above, the production method of the invention makes it possible to produce a silicon wafer having a chamfered portion whose cross-sectional shape dimensions exhibit extremely small variations even after the etching process by using the chamfering apparatus 1 of the invention. This makes it possible to meet demands for a high degree of precision, for example, ±25 µm or less for the 32 nm node, satisfactorily.

It is to be understood that the present invention is not limited in any way by the embodiment thereof described above. The above embodiment is merely an example, and anything that has substantially the same structure as the technical idea recited in the claims of the present invention and that offers similar workings and benefits falls within the technical scope of the present invention.

For example, in the example described above, a demonstration was conducted on a silicon wafer having a (100) crystal axis on the principal surface. However, for other orientation varieties, it is also possible to obtain an etched silicon wafer having a chamfered portion whose cross-sectional shape dimensions exhibit extremely small variations in the circumferential direction by varying the R value depending on the circumferential crystal orientation of the silicon wafer in a similar manner. Moreover, as for the R value of the end of the chamfered shape, the R value being set this time, it cannot be set uniquely because the target value thereof differs from customer to customer. Thus, an appropriate set value may be obtained on a case-by-case basis by conducting a study or the like.

In addition, as an etchant in the example, a sodium hydroxide solution is used. However, by using a potassium hydroxide solution, which is also an alkalie solution, due to the same dependence of a crystal on orientation, it is possible to obtain the same results as those of the example described above.

Furthermore, the above explanation deals with a case in which, in the main test, after performing rough chamfering, non-uniform precise chamfering is performed as precise chamfering after lapping or double-side grinding, and etching is then performed. However, it is also possible to perform, after performing rough chamfering, uniform precise chamfering after lapping or double-side grinding, then perform non-uniform precise chamfering, and perform etching.

The invention claimed is:

1. A method for producing a silicon wafer, having at least the steps of:
   chamfering an outer edge of a silicon wafer; and
   performing etching processing on at least a chamfered portion of the silicon wafer after the chamfering step, wherein
   a silicon wafer is produced by performing the etching step after performing the chamfering step in such a way as to change a chamfered shape of an outer edge depending on a circumferential position of the silicon wafer based on an amount of change in shape caused by etching depending on the circumferential position of the silicon wafer in the etching step such that a cross-sectional shape of the chamfered portion varies depending on the circumferential position of the silicon wafer.

2. The method for producing a silicon wafer according to claim 1, wherein
   the amount of change in shape caused by etching depending on the circumferential position of the silicon wafer is obtained by conducting a test in advance.

3. The method for producing a silicon wafer according to claim 1, wherein
   the etching step is performed by using a sodium hydroxide solution and/or a potassium hydroxide solution.

4. The method for producing a silicon wafer according to claim 2, wherein
   the etching step is performed by using a sodium hydroxide solution and/or a potassium hydroxide solution.

* * * * *